(12) United States Patent
Ueda et al.

(10) Patent No.: US 9,403,977 B2
(45) Date of Patent: Aug. 2, 2016

(54) PHOTOSENSITIVE RESIN COMPOSITION AND PHOTOSENSITIVE FILM USING SAME

(71) Applicant: HITACHI CHEMICAL COMPANY, LTD., Tokyo (JP)

(72) Inventors: Satoko Ueda, Chikusei (JP); Ken Sawabe, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/651,081

(22) PCT Filed: Dec. 5, 2013

(86) PCT No.: PCT/JP2013/082703
§ 371 (c)(1),
(2) Date: Jun. 10, 2015

(87) PCT Pub. No.: WO2014/091997
PCT Pub. Date: Jun. 19, 2014

(65) Prior Publication Data
US 2015/0315379 A1    Nov. 5, 2015

(30) Foreign Application Priority Data
Dec. 12, 2012    (JP) ................................. 2012-271369

(51) Int. Cl.
| | |
|---|---|
| *C08F 2/46* | (2006.01) |
| *C08F 2/50* | (2006.01) |
| *B29C 71/04* | (2006.01) |
| *C08G 61/04* | (2006.01) |
| *C08L 63/04* | (2006.01) |
| *C08J 5/18* | (2006.01) |
| *G03F 7/022* | (2006.01) |
| *G03F 7/023* | (2006.01) |
| *G03F 7/004* | (2006.01) |

(52) U.S. Cl.
CPC .. *C08L 63/04* (2013.01); *C08J 5/18* (2013.01); *G03F 7/004* (2013.01); *G03F 7/023* (2013.01); *G03F 7/0226* (2013.01); *G03F 7/0236* (2013.01); *C08J 2363/04* (2013.01); *C08J 2463/04* (2013.01); *C08J 2463/10* (2013.01); *C08L 2203/16* (2013.01); *C08L 2205/025* (2013.01); *C08L 2205/03* (2013.01)

(58) Field of Classification Search
CPC ............... C08L 63/04; C08L 2203/16; C08L 2205/025; C08L 2205/03; C08J 5/18; C08J 2363/04; C08J 2463/04; C08J 2463/10
USPC ............. 522/58, 49, 6, 71, 189, 184, 1; 520/1
See application file for complete search history.

(56) References Cited

U.S. PATENT DOCUMENTS

| | | | | |
|---|---|---|---|---|
| 2009/0214979 | A1* | 8/2009 | Sawabe | G03F 7/0236 430/192 |
| 2011/0097835 | A1 | 4/2011 | Park et al. | |
| 2013/0224655 | A1* | 8/2013 | Kage | G03F 7/0236 430/270.1 |

FOREIGN PATENT DOCUMENTS

| | | |
|---|---|---|
| EP | 2328027 A1 | 6/2011 |
| JP | 3208055 A | 9/1991 |
| JP | 3225341 A | 10/1991 |
| JP | 3236216 A | 10/1991 |
| JP | H06027657 A | 2/1994 |
| JP | 9160232 A | 6/1997 |
| JP | 2000105466 A | 4/2000 |
| JP | 2007316577 A | 10/2006 |
| JP | 2008112134 A | 5/2008 |
| JP | 2010039214 A | 2/2010 |
| JP | 2010039237 A | 2/2010 |
| JP | 2010-145604 * | 7/2010 |
| JP | 2010145604 A | 7/2010 |
| JP | 2012-252095 * | 12/2012 |
| JP | 2012252095 A | 12/2012 |
| JP | 2013228416 A | 11/2013 |
| WO | 2007026475 A1 | 8/2007 |
| WO | 2012-063635 * | 5/2012 |
| WO | 2012063635 A1 | 5/2012 |

OTHER PUBLICATIONS

Namikawa, JP 2010-145604 Machine Translation, Jul. 1, 2010.*
Ueda et al, JP 2012-252095 Machine Translation, Dec. 20, 2012.*
International Search Report for International Application No. PCT/JP2013/082703 dated Jan. 7, 2014.
International Preliminary Report on Patentability of WO Appln. PCT/JP2013/082703 dated Jun. 25, 2015 in English.
Search Report of EP Patent Application No. 13862803.7 dated May 17, 2016 in English.

* cited by examiner

*Primary Examiner* — Ling Choi
*Assistant Examiner* — Jessica E Whiteley
(74) *Attorney, Agent, or Firm* — Fitch, Even, Tabin & Flannery, LLP

(57) ABSTRACT

The present invention relates to a positive-type photosensitive resin composition comprising (A) a modified novolac-type phenol resin having an unsaturated hydrocarbon group, (B) a novolac-type phenol resin obtained from metacresol and paracresol, (C) a novolac-type phenol resin obtained from orthocresol, (D) a compound generating an acid by light, and (E) a polybasic acid or a polybasic acid anhydride, wherein the content of the (E) component is lower than 40 parts by mass per 100 parts by mass of the total amount of the (A) component, the (B) component, the (C) component and the (D) component.

15 Claims, 4 Drawing Sheets

(a)

(b)

(c)

(d)

(e)

(f)

(g)

(h)

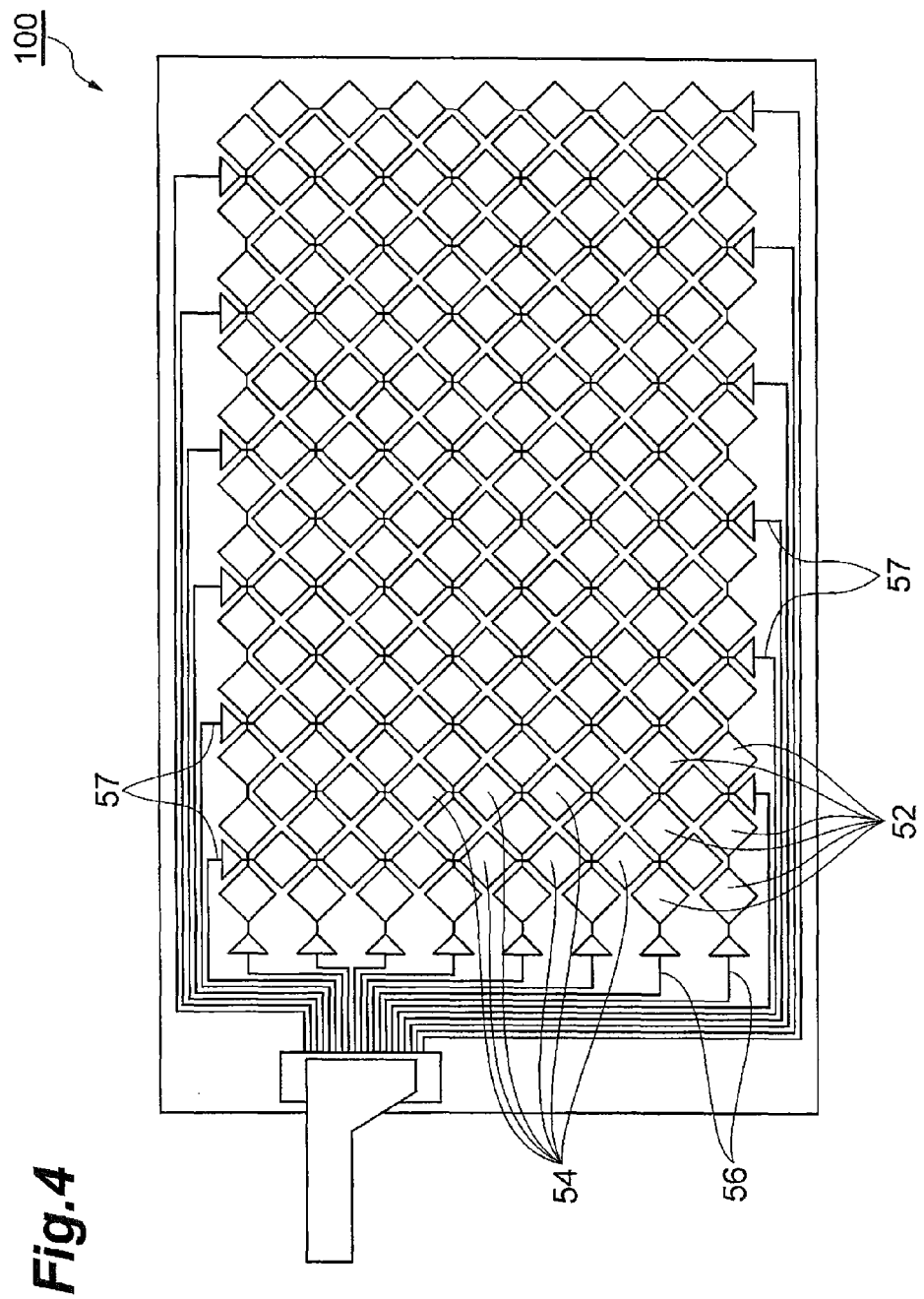

PHOTOSENSITIVE RESIN COMPOSITION AND PHOTOSENSITIVE FILM USING SAME

TECHNICAL FIELD

The present invention relates to a photosensitive resin composition, and a photosensitive film using the same.

BACKGROUND ART

As image forming methods utilized for patterning and the like of electronic components such as semiconductor integrated circuits, liquid crystal display devices and printed wiring boards, there are known methods of utilizing positive-type photoresists using as a raw material a positive-type photosensitive resin composition containing a novolac-type phenol resin and 1,2-quinonediazide compound (for example, Patent Literatures 1 to 6).

In the case where a photosensitive layer is formed by applying a positive-type photosensitive resin composition on a substrate or the like, it is usual that the film thickness of the layer is 0.5 to several microns. When such a positive-type photosensitive resin composition is used, the formation of an image pattern over wide dimensional ranges is enabled. The dimensional range has wide ranges of, for example, from a sub-half-micron region of about 0.3 μm to a considerably large dimensional width of about several hundred microns. Thereby, the microfabrication of a wide variety of substrate surfaces is enabled.

CITATION LIST

Patent Literature

Patent Literature 1: JP 06-027657 A
Patent Literature 2: JP 2000-105466 A
Patent Literature 3: JP 2007-316577 A
Patent Literature 4: WO 07/026475 A
Patent Literature 5: JP 2008-112134 A
Patent Literature 6: JP 2010-039214 A

SUMMARY OF INVENTION

Technical Problem

A positive-type photosensitive resin composition has the following properties: portions thereof irradiated with light (exposed portions) can be removed with an alkali aqueous solution, and portions thereof not irradiated with light (unexposed portions) remain as a film. Thus, a pattern can be formed by again irradiating the remaining film with light. Then, for a substrate having two or more metal layers, there has been studied the formation of patterns of the metal layers on the substrate by repeating a step of etching the metal layers after exposure and development of a photosensitive layer using a positive-type photosensitive resin composition.

However, it is difficult for a conventional positive-type photosensitive resin composition to form a photosensitive layer simultaneously satisfying the developing solution resistance of unexposed portions and the developability of exposed portions in the repeated development.

Particularly in image formation applications to be utilized for patterning and the like of touch panel sensors, metal layers to be used are diversified accompanying the wiring micronization, the size reduction, the cost reduction, the avoidance of risks due to being free from rare metals, and the energy saving.

Then, it is an object of the present invention to provide: a positive-type photosensitive resin composition to form a photosensitive layer which is excellent in its adhesion force to various types of metals, sufficiently excellent in the developability of exposed portions and the developing solution resistance of unexposed portions, and capable of being repeatedly developed with a weak alkali developing solution; and a photosensitive film using the positive-type photosensitive resin composition.

Solution to Problem

The present invention provides a positive-type photosensitive resin composition comprising (A) a modified novolac-type phenol resin having an unsaturated hydrocarbon group, (B) a novolac-type phenol resin obtained from metacresol and paracresol, (C) a novolac-type phenol resin obtained from orthocresol, (D) a compound generating an acid by light, and (E) a polybasic acid or a polybasic acid anhydride, wherein the content of the (E) component is lower than 40 parts by mass per 100 parts by mass of the total amount of the (A) component, the (B) component, the (C) component and the (D) component.

The weight-average molecular weight of the (A) component may be 1000 to 15000. Further, the weight-average molecular weight of the (B) component may be 800 to 50000. Further, the weight-average molecular weight of the (C) component may be 800 to 5000.

The content of the (C) component may be 20 to 60 parts by mass per 100 parts by mass of the total amount of the (A) component, the (B) component, the (C) component and the (D) component.

The unsaturated hydrocarbon group of the (A) component may have 4 to 100 carbon atoms.

The photosensitive resin composition can further comprise (F) a fluorine-based surfactant. The photosensitive resin composition can further comprise (G) an adhesivity-imparting agent.

The present invention also provides a photosensitive film having a support film at least one surface of which has been subjected to a release treatment, and a photosensitive layer provided on the surface of the support film which has been subjected to the release treatment, wherein the photosensitive layer is a layer formed of the positive-type photosensitive resin composition according to the present invention.

Advantageous Effects of Invention

According to the present invention, there can be provided: a positive-type photosensitive resin composition to form a photosensitive layer which is excellent in its adhesion force to various types of metals, sufficiently excellent in the developability of exposed portions and the developing solution resistance of unexposed portions, and capable of being repeatedly developed with a weak alkali developing solution; and a photosensitive film using the positive-type photosensitive resin composition.

BRIEF DESCRIPTION OF DRAWINGS

FIG. 4 is a top view illustrating one embodiment of a touch panel obtained by utilizing the present invention.

DESCRIPTION OF EMBODIMENTS

Figure 1:
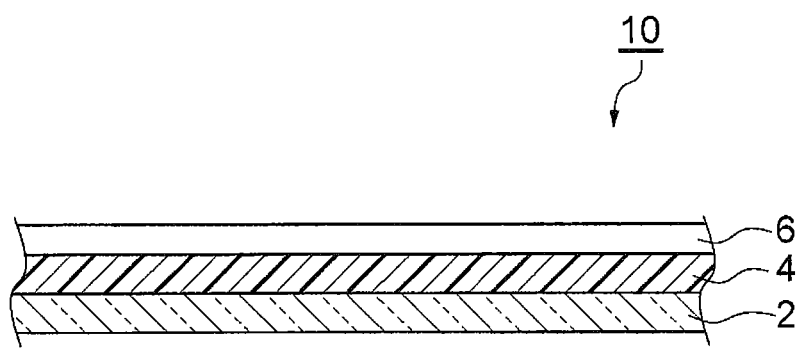
FIG. 1 is a schematic cross-sectional view illustrating one embodiment of the photosensitive film according to the present invention.

Hereinafter, the preferred embodiments according to the present invention will be described in detail, by reference to the drawings, as needed. Here, in the drawings, the same reference sign is attached to the same element and the duplicated description will be omitted. Further the vertical and horizontal and other positional relations are based on the positional relations illustrated in the drawings unless otherwise specified. Further the dimensional ratios in the drawings are not limited to the ratios illustrated in the drawings.

In the present description, the term "layer" encompasses a structure of a shape formed across a whole surface as well as a structure of a shape formed partly, when observed as a plan view. In the present description, the term "step" encompasses not only an independent step but also a step by which a predetermined object of the step is accomplished even in the case where the step cannot clearly be distinguished from another step. In the present description, the numerical range indicated using the term "to" indicates a range including numerical values mentioned before and after the term "to" as a minimum value and a maximum value thereof, respectively.

A positive-type photosensitive resin composition according to the present embodiment comprises, as essential components, a modified novolac-type phenol resin having unsaturated hydrocarbon groups as an (A) component, a novolac-type phenol resin obtained from metacresol and paracresol as a (B) component, a novolac-type phenol resin obtained from orthocresol as a (C) component, a compound generating an acid by light as a (D) component, and a polybasic acid or a polybasic acid anhydride as an (E) component, wherein the content of the (E) component is lower than 40 parts by mass per 100 parts by mass of the total amount of the (A) component, the (B) component, the (C) component and the (D) component.

Hereinafter, each component constituting the positive-type photosensitive resin composition will be described in detail.

<(A) Component>

The (A) component is a modified novolac-type phenol resin having unsaturated hydrocarbon groups. The novolac-type phenol resin is a polycondensed product of a phenol derivative containing orthocresol, or metacresol and paracresol as main components with an aldehyde. The polycondensation is carried out in the presence of a catalyst such as an acid. The modified phenol resin having unsaturated hydrocarbon groups may be a polycondensed product of a reaction product (hereinafter, referred to as "unsaturated hydrocarbon group-modified phenol derivative") of a phenol derivative and a compound having unsaturated hydrocarbon groups (hereinafter, simply referred to as "unsaturated hydrocarbon group-containing compound" in some cases) with an aldehyde, or may be a reaction product of a phenol resin and an unsaturated hydrocarbon group-containing compound.

The modified novolac-type phenol resin having unsaturated hydrocarbon groups is usually a polycondensed product of a reaction product of a phenol derivative such as the above cresols and a compound having unsaturated hydrocarbon groups with an aldehyde, or a reaction product of a novolac-type phenol resin and an unsaturated hydrocarbon group-containing compound.

As the modified novolac-type phenol resin having unsaturated hydrocarbon groups, there can be used a novolac-type phenol resin obtained from an orthocresol modified with a compound having unsaturated hydrocarbon groups, or a metacresol and a paracresol modified with a compound having unsaturated hydrocarbon groups. Further as the modified novolac-type phenol resin having unsaturated hydrocarbon groups, there can also be used a resin of a novolac-type phenol resin modified with an unsaturated hydrocarbon group-containing compound.

In the case of using a phenol derivative containing metacresol and paracresol as main components, with respect to the mass ratio of metacresol to paracresol, from the viewpoint of the developability and the developing solution resistance, metacresol/paracresol is preferably 30/70 to 70/30, more preferably 35/65 to 65/35, and still more preferably 40/60 to 60/40.

As a phenol derivative to be used in order to obtain an (A) component, a phenol derivative other than cresol can be copolymerized. Examples of the phenol derivative other than cresol include phenol; alkyl phenols such as 2-ethylphenol, 3-ethylphenol, 4-ethylphenol, 2-butylphenol, 3-butylphenol, 4-butylphenol, 2,3-xylenol, 2,4-xylenol, 2,5-xylenol, 2,6-xylenol, 3,4-xylenol, 3,5-xylenol, 2,3,5-trimethylphenol and 3,4,5-trimethylphenol; alkoxyphenols such as methoxyphenol and 2-methoxy-4-methylphenol; alkenylphenols such as vinylphenol and allylphenol; aralkylphenols such as benzylphenol; alkoxycarbonylphenols such as methoxycarbonylphenol; arylcarbonylphenols such as benzoyloxyphenol; halogenated phenols such as chlorophenol; and polyhydroxybenzenes such as catechol, resorcinol and pyrogallol. These are used singly or in a combination of two or more. These phenol derivatives can be added in the range of not impairing the advantageous effect of the present invention, and the content of the phenol derivatives is preferably 30% by mass or smaller based on the total amount of the phenol derivatives to be used in order to obtain an (A) component.

Examples of the aldehyde include formaldehyde, acetoaldehyde, acetone, glyceraldehyde and methyl glyoxylate. A precursor of formaldehyde such as paraformaldehyde or trioxane may be used for a reaction with the phenol derivative. These are used singly or in a combination of two or more.

From the viewpoint of the adhesivity of a resist pattern and the flexibility of a photosensitive layer, it is preferable for the unsaturated hydrocarbon group of the unsaturated hydrocarbon group-containing compound to contain two or more unsaturated groups. Further, from the viewpoint of the compatibility when a resin composition is formulated and the flexibility when a photosensitive layer is formed, the number of carbon atoms of the unsaturated hydrocarbon group is preferably 4 to 100, more preferably 8 to 80, and still more preferably 10 to 60.

Examples of the unsaturated hydrocarbon group-containing compound include unsaturated hydrocarbons having 4 to 100 carbon atoms, polybutadienes having carboxyl groups, epoxidized polybutadienes, linoleyl alcohol, oleyl alcohol, unsaturated fatty acids and unsaturated fatty acid esters. Preferable unsaturated fatty acids include crotonic acid, myristoleic acid, palmitoleic acid, oleic acid, elaidic acid, vaccenic acid, gadoleic acid, erucic acid, nervonic acid, linolic acid, α-linolenic acid, eleostearic acid, stearidonic acid, arachidonic acid, eicosapentaenoic acid, clupanodonic acid and docosahexaenoic acid. Among these, particularly esters of an unsaturated fatty acid having 8 to 30 carbon atoms and a mono- to trihydric alcohol having 1 to 10 carbon atoms are more preferable; and esters of an unsaturated fatty acid having 8 to 30 carbon atoms and glycerol, which is a trihydric alcohol, are especially preferable.

The esters of an unsaturated fatty acid having 8 to 30 carbon atoms and glycerol are commercially available as vegetable oils. The main component of a vegetable oil is a mixture of esters of various types of unsaturated fatty acids having different compositions and glycerol; and the unsaturated fatty acids include the above-mentioned unsaturated fatty acids. Examples of the vegetable oils include nondrying oils having iodine value of 100 or less, semidrying oils having iodine value of more than 100 and less than 130, and drying oils having iodine value of 130 or more. Examples of the nondrying oils include olive oil, morning glory seed oil, cashew nut oil, sasanqua oil, camellia oil, castor oil and peanut oil. Examples of the semidrying oils include corn oil, cotton seed oil and sesame oil. Examples of the drying oils include tung oil, linseed oil, soybean oil, walnut oil, safflower oil, sunflower oil, perilla oil and poppy seed oil. Further as the esters of an unsaturated fatty acid having 8 to 30 carbon atoms and glycerol, processed vegetable oils obtained by processing these vegetable oils may be used.

In a reaction of a phenol derivative or a novolac-type phenol resin with a vegetable oil, from the viewpoint of preventing the gelation accompanying an excessive progress of the reaction and improving the yield, it is preferable to use a nondrying oil among the above vegetable oils. By contrast, from the viewpoint of improving the adhesivity and the mechanical property of a resist pattern, it is preferable to use a drying oil. Among drying oils, tung oil, linseed oil, soybean oil, walnut oil and safflower oil are preferable, and tung oil and linseed oil are more preferable, because being capable of effectively and surely exhibiting the advantageous effect of the present invention.

These unsaturated hydrocarbon group-containing compounds are used singly or in a combination of two or more.

In the case where a modified novolac-type phenol resin having unsaturated hydrocarbon groups is prepared, first, the above phenol derivative and the above unsaturated hydrocarbon group-containing compound are allowed to react to be thereby able to fabricate an unsaturated hydrocarbon group-modified phenol derivative. It is preferable to carry out the reaction at 50 to 130° C. With respect to the reaction ratio between the phenol derivative and the unsaturated hydrocarbon group-containing compound, the unsaturated hydrocarbon group-containing compound is preferably 1 to 100 parts by mass, more preferably 5 to 50 parts by mass, per 100 parts by mass of the phenol derivative, from the viewpoint of improving the flexibility of a photosensitive layer to be formed from a positive-type photosensitive resin composition. In the reaction, p-toluenesulfonic acid, trifluoromethanesulfonic acid or the like may be used as a catalyst, as required.

The unsaturated hydrocarbon group-modified phenol derivative produced by the above reaction and an aldehyde are polycondensed to thereby produce a novolac-type phenol resin modified with an unsaturated hydrocarbon group-containing compound.

The reaction of the aldehyde and the unsaturated hydrocarbon group-modified phenol derivative is a polycondensation reaction, and a conventionally well-known synthesis condition of phenol resins can be used. It is preferable to carry out the reaction in the presence of a catalyst such as an acid or a base; and use of an acid catalyst is more preferable. Examples of the acid catalyst include hydrochloric acid, sulfuric acid, formic acid, acetic acid, p-toluenesulfonic acid and oxalic acid. These acid catalysts can be used singly or in a combination of two or more.

It is preferable to carry out the above polycondensation reaction usually at a reaction temperature of 100 to 120° C. The reaction time is usually 1 to 50 hours, though depending on the kind or the amount of a catalyst to be used. After the finish of the reaction, a modified novolac-type phenol resin having unsaturated hydrocarbon groups is obtained by dehydrating a reaction product at a temperature of 200° C. or lower under reduced pressure. Here, in the reaction, a solvent such as toluene, xylene or methanol can be used.

A modified novolac-type phenol resin having unsaturated hydrocarbon groups can also be obtained by polycondensing the above-mentioned unsaturated hydrocarbon group-modified phenol derivative with an aldehyde together with a compound other than phenol, such as m-xylene. In this case, the molar ratio of the compound other than phenol to a compound obtained by reacting a phenol derivative with an unsaturated hydrocarbon group-containing compound is preferably lower than 0.5.

A modified novolac-type phenol resin having unsaturated hydrocarbon groups can also be obtained by reacting a novolac-type phenol resin with an unsaturated hydrocarbon group-containing compound.

It is preferable to carry out the reaction of the novolac-type phenol resin with the unsaturated hydrocarbon group-containing compound usually at 50 to 130° C. With respect to the reaction ratio between the novolac-type phenol resin and the unsaturated hydrocarbon group-containing compound, the unsaturated hydrocarbon group-containing compound is preferably 1 to 100 parts by mass, more preferably 2 to 70 parts by mass, and still more preferably 10 to 30 parts by mass, per 100 parts by mass of the novolac-type phenol resin, from the viewpoint of improving the flexibility of a photosensitive layer. At this time, p-toluenesulfonic acid, trifluoromethanesulfonic acid or the like may be used as a catalyst, as required. In the reaction, a solvent such as toluene, xylene, methanol or tetrahydrofuran can be used.

There can also be used, as an (A) component, a phenol resin acid-modified by reacting phenolic hydroxyl groups remaining in the above-mentioned modified novolac-type phenol resin having unsaturated hydrocarbon groups further with a polybasic acid anhydride. The acid modification with a polybasic acid anhydride introduces carboxyl groups and the acid-modified phenol resin is enabled to be easily developed even with a weak alkali aqueous solution (developing solution).

The polybasic acid anhydride is not especially limited as long as having an acid anhydride group formed by dehydrating condensation of carboxyl groups of a polybasic acid having a plurality of carboxyl groups. Examples of the polybasic acid anhydride include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and trimellitic anhydride, and aromatic tetrabasic acid dianhydrides such as biphenyltetracarboxylic dianhydride, naphthalenetetracarboxylic dianhydride, diphenyl ether tetracarboxylic dianhydride, butanetetracarboxylic dianhydride, cyclopentanetetracarboxylic dianhydride, pyromellitic anhydride and benzophenonetetracarboxylic dianhydride. These may be used singly or in a combination of two or more. Among these, it is preferable for the polybasic acid anhydride to be a dibasic acid anhydride; and it is more preferable for the polybasic acid anhydride to be one or more selected from the group consisting of tetrahydrophthalic anhydride, succinic anhydride and hexahydrophthalic anhydride. This case has an advantage of being capable of forming a resist pattern having a better shape.

With respect to the molecular weight of an (A) component, the weight-average molecular weight (Mw) thereof is preferably 1000 to 30000, more preferably 1000 to 15000, still more preferably 1200 to 14000, and especially preferably 1500 to 12000, in consideration of the balance among the solubility to an alkali aqueous solution, the photosensitive properties (sensitivity, resolution) and the mechanical property.

Here, the weight-average molecular weight in the present description is a value acquired by a measurement using gel permeation chromatography (GPC) and a conversion using a standard polystyrene calibration curve. The measurement condition in the GPC is as follows.

Pump: L-6200 type (manufactured by Hitachi, Ltd., trade name)
Column: TSKgel-G5000HXL (manufactured by Tosoh Corp., trade name)
Detector: L-3300RI type (manufactured by Hitachi, Ltd., trade name)
Eluate: tetrahydrofuran
Temperature: 30° C.
Flow volume: 1.0 mL/min From the viewpoint of simultaneously satisfying the mechanical strength and the developability of a photosensitive layer to be formed from a positive-type photosensitive resin composition, the content of the (A) component in the photosensitive resin composition is preferably 10 to 35 parts by mass, more preferably 15 to 30 parts by mass, and still more preferably 15 to 25 parts by mass, per 100 parts by mass of the total amount of the (A) component, the (B) component, the (C) component and the (D) component.

<(B) Component>

The (B) component is a polycondensed product of a phenol derivative containing metacresol and paracresol as main components with an aldehyde. The polycondensation is carried out in the presence of a catalyst such as an acid. The (B) component is an unmodified novolac-type phenol resin having no unsaturated hydrocarbon groups. As the phenol derivative to be used in order to obtain a (B) component, a phenol derivative other than metacresol and paracresol can be copolymerized as long as the advantageous effect of the present invention is not impaired. The total amount of metacresol and paracresol is preferably 85% by mass or larger based on the total amount of the phenol derivative to be used in order to obtain a (B) component.

As the aldehyde, the same aldehyde as in the case of the (A) component can be used.

The content of metacresol is preferably 30 to 70% by mass, more preferably 35 to 65%, and still more preferably 40 to 60% by mass, based on the total amount of a mixture of metacresol and paracresol.

With respect to the molecular weight of a (B) component, the weight-average molecular weight (Mw) thereof is preferably 800 to 50000, more preferably 1000 to 25000, and still more preferably 1000 to 12000, in consideration of the balance among the solubility to an alkali aqueous solution, the photosensitive properties (sensitivity, resolution) and the mechanical property.

From the viewpoint of simultaneously satisfying the mechanical strength and the developability of a photosensitive layer, the content of the (B) component in a photosensitive resin composition is preferably 5 to 30 parts by mass, more preferably 10 to 25 parts by mass, and still more preferably 15 to 20 parts by mass, per 100 parts by mass of the total amount of the (A) component, the (B) component, the (C) component and the (D) component.

<(C) Component>

The (C) component is a polycondensed product of a phenol derivative containing orthocresol as a main component with an aldehyde. The polycondensation is carried out in the presence of a catalyst such as an acid. The (C) component is an unmodified novolac-type phenol resin having no unsaturated hydrocarbon groups.

As the phenol derivative to be used in order to obtain the (C) component, a phenol derivative other than orthocresol can be copolymerized. Examples of the phenol derivative other than orthocresol include phenol; alkyl phenols such as metacresol, paracresol, 2-ethylphenol, 3-ethylphenol, 4-ethylphenol, 2-butylphenol, 3-butylphenol, 4-butylphenol, 2,3-xylenol, 2,4-xylenol, 2,5-xylenol, 2,6-xylenol, 3,4-xylenol, 3,5-xylenol, 2,3,5-trimethylphenol and 3,4,5-trimethylphenol; alkoxyphenols such as methoxyphenol and 2-methoxy-4-methylphenol; alkenylphenols such as vinylphenol and allylphenol; aralkylphenols such as benzylphenol; alkoxycarbonylphenols such as methoxycarbonylphenol; arylcarbonylphenols such as benzoyloxyphenol; halogenated phenols such as chlorophenol; and polyhydroxybenzenes such as catechol, resorcinol and pyrogallol. These are used singly or in a combination of two or more. These phenol derivatives can be added in the range of not impairing the advantageous effect of the present invention, and the content of the phenol derivatives is preferably 15% by mass or smaller based on the total amount of the phenol derivative to be used in order to obtain a (C) component.

Examples of the aldehyde include the same compounds as in the case of the (A) component.

With respect to the molecular weight of a (C) component, the weight-average molecular weight thereof is preferably 500 to 5000, more preferably 800 to 4000, and still more preferably 1000 to 3000, from the viewpoint of being able to well balancedly improve the developing solution resistance of unexposed portions and the developability of exposed portions in a photosensitive layer.

From the viewpoint of simultaneously satisfying the developability of a photosensitive layer and the adhesivity to various types of metals, the content of the (C) component is preferably 20 to 60 parts by mass, more preferably 30 to 60 parts by mass, and still more preferably 35 to 50 parts by mass, per 100 parts by mass of the total amount of the (A) component, the (B) component, the (C) component and the (D) component.

<(D) Component>

A compound generating an acid by light, which is the (D) component, is used as a photosensitive agent. Such a (D) component has a function of generating an acid by light irradiation and increasing the solubility of light-irradiated portions to an alkali aqueous solution. As the (D) component, a compound usually called a photoacid generating agent can be used. Specific examples of the (D) component include o-quinonediazide compounds, aryldiazonium salts, diaryliodonium salts and triarylsulfonium salts. Among these, 1,2-quinonediazide compounds are preferable because being high in the sensitivity.

The 1,2-quinonediazide compounds are 1,2-quinonediamide and/or its derivatives. Such a 1,2-quinonediazide compound is a compound obtained by reacting an organic compound having a hydroxyl group or an amino group (hereinafter, simply referred to as "organic compound") with a 1,2-quinonediazide compound having a sulfo group and/or a sulfonyl chloride group. At this time, a hydroxyl group or an amino group of the organic compound is bonded with a sulfo group or a sulfonyl chloride group of the 1,2-quinonediazide compound. Here, it suffices if at least one bond above-mentioned is present in the molecule of the 1,2-quinonediazide compound to be obtained.

Examples of the 1,2-quinonediazide compound having a sulfo group and/or a sulfonyl chloride group include 1,2-naphthoquinone-2-diazide-4-sulfonic acid, 1,2-naphthoquinone-2-diazide-5-sulfonic acid, orthoanthraquinonediazidesulfonic acid, 1,2-naphthoquinone-2-diazide-4-sulfonyl chloride, 1,2-naphthoquinone-2-diazide-5-sulfonyl chloride and orthoanthraquinonediazidesulfonyl chloride. Among these, one or more compounds selected from the group consisting of 1,2-naphthoquinone-2-diazide-4-sulfonic acid, 1,2-naphthoquinone-2-diazide-5-sulfonic acid, 1,2-naphthoquinone-2-diazide-4-sulfonyl chloride and 1,2-naphthoquinone-2-diazide-5-sulfonyl chloride are preferable. These 1,2-quinonediazide compounds having a sulfo group and/or a sulfonyl chloride group, since well dissolving in a solvent, can raise the reaction efficiency with the organic compound.

Examples of the organic compound include polyhydroxybenzophenones, bis[(poly)hydroxyphenyl]alkanes, tris(hydroxyphenyl)methanes or methyl-substituted products thereof, bis(cyclohexylhydroxyphenyl)(hydroxyphenyl)methanes or methyl-substituted products thereof, phenol, p-methoxyphenol, dimethylphenol, hydroquinone, naphthol, pyrocatechol, pyrogallol, pyrogallol monomethyl ether, pyrogallol-1,3-dimethyl ether, gallic acid, aniline, p-aminodiphenylamine, 4,4'-diaminobenzophenone, novolac resins, pyrogallol-acetone resins and homopolymers of p-hydroxystyrene or copolymers with monomers copolymerizable therewith. These are used singly or in a combination of two or more.

Examples of the polyhydroxybenzophenones include 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone and 2,3,3',4,4',5'-hexahydroxybenzophenone. These are used singly or in a combination of two or more.

Examples of the bis[(poly)hydroxyphenyl]alkanes include bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol and 3,3'-dimethyl-{1-[4-[2-(3-methyl-4-hydroxyphenyl)-2-propyl]phenyl]et hylidene}bisphenol. These are used singly or in a combination of two or more.

Examples of the tris(hydroxyphenyl)methanes or methyl-substituted products thereof include tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane and bis(4-hydroxy-3,5-dimethylphenyl)-3,4-dihydroxyphenylmethane. These are used singly or in a combination of two or more.

Examples of the bis(cyclohexylhydroxyphenyl)(hydroxyphenyl)methanes or methyl-substituted products thereof include bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane and bis(5-cyclohexyl-2-hydroxy-4-methylphenyl)-4-hydroxyphenylmethane. These are used singly or in a combination of two or more.

It is preferable for among these, the organic compound to be a polyhydroxybenzophenone, a bis[(poly)hydroxyphenyl]alkane, a tris(hydroxyphenyl)methane, and/or a bis(cyclohexylhydroxyphenyl)(hydroxyphenyl)methane.

It is more preferable for the organic compound to be a compound represented by one of the following formulae (1) to (3). This case has an advantage of being better in the image contrast because the difference in solubility of a photosensitive resin composition to a developing solution before light irradiation thereto and after the light irradiation thereto becomes large. These are used singly or in a combination of two or more.

[Chemical Formula 1]

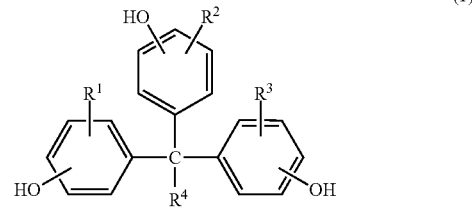

(1)

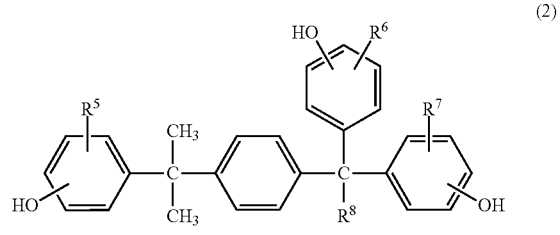

(2)

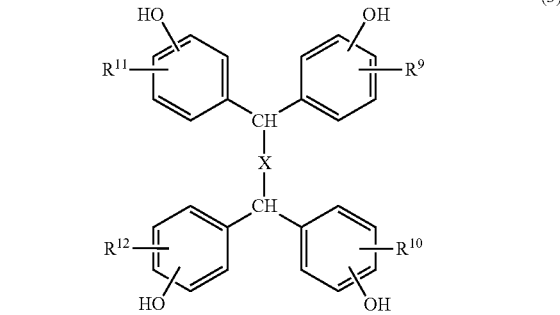

(3)

Here, in the formulae (1) to (3), $R^1$, $R^2$, $R^3$, $R^4$, $R^5$, $R^6$, $R^7$, $R^8$, $R^9$, $R^{10}$, $R^{11}$ and $R^{12}$ each independently denote a hydrogen atom, a substituted or nonsubstituted alkyl group having 1 to 5 carbon atoms or a substituted or nonsubstituted alkoxy group having 1 to 5 carbon atoms; and X denotes a single bond, an oxygen atom or a phenylene group.

In the case where the organic compound is a compound represented by one of the above formulae (1) to (3), it is preferable for the 1,2-quinonediazide compound having a sulfo group and/or a sulfonyl chloride group to be 1,2-naphthoquinone-2-diazide-4-sulfonic acid, 1,2-naphthoquinone-2-diazide-5-sulfonic acid, 1,2-naphthoquinone-2-diazide-4-sulfonyl chloride or 1,2-naphthoquinone-2-diazide-5-sulfonyl chloride. Since these 1,2-quinonediazide compounds having a sulfo group and/or a sulfonyl chloride group are good in the compatibility with compounds represented by the above formulae (1) to (3), they can reduce the amount of aggregates produced when at least one selected from the group consisting of an (A) component, a (B) component and a (C) component is mixed with a (D) component. When a photosensitive resin composition containing these is used as a photosensitive component of a positive-type photoresist, the positive-type photoresist becomes better in the sensitivity, the image contrast and the heat resistance.

It is more preferable for a compound represented by one of the above formulae (1) to (3) to be a compound represented by one of the following formulae (4) to (6), respectively. This case has an advantage of being better in the photosensitivity.

[Chemical Formula 2]

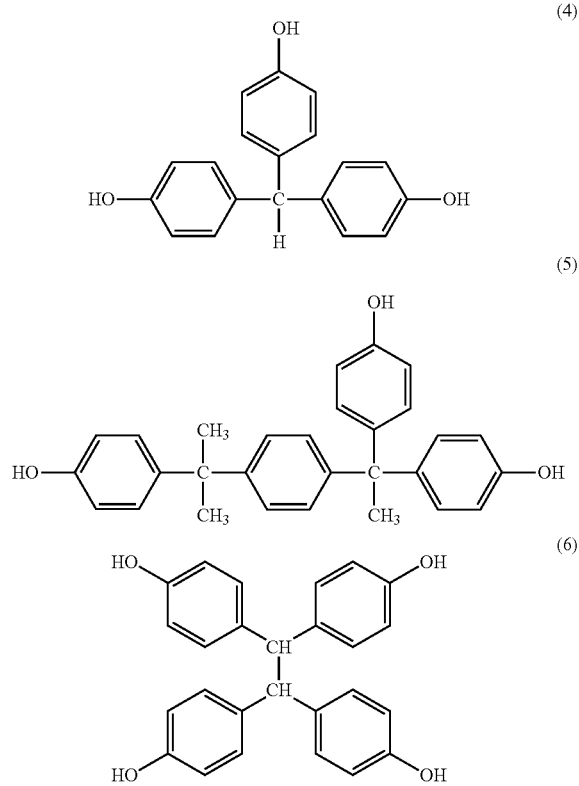

Examples of the method for synthesizing a 1,2-quinonediazide compound using a compound represented by one of the above formulae (4) to (6) includes the following method. Specifically, a compound represented by one of the above formulae (4) to (6) and a 1,2-naphthoquinone-2-diazide-sulfonyl chloride are added in a solvent such as dioxane or THF (tetrahydrofuran), and the resulting solution is allowed to react in the presence of an alkali catalyst such as triethylamine, triethanolamine, an alkali carbonate or an alkali hydrogencarbonate. At this time, there is synthesized a 1,2-quinonediazide compound in which a hydroxyl group of the compound represented by one of the above formulae (4) to (6) and a sulfonyl group of 1,2-naphthoquinone-2-diazide-sulfonyl chloride are condensed. Here, it suffices if at least one bond between a hydroxyl group of the compound represented by one of the above formulae (4) to (6) and a sulfonyl group of the 1,2-naphthoquinone-2-diazide-sulfonyl chloride is present in the molecule of the 1,2-quinonediazide compound to be obtained.

As 1,2-naphthoquinone-2-diazide-sulfonyl chloride, 1,2-naphthoquinone-2-diazide-4-sulfonyl chloride or 1,2-naphthoquinone-2-diazide-5-sulfonyl chloride is suitable. These may be used singly or in a combination of two or more.

From the viewpoint of the photosensitive property and the mechanical property, the content of the (D) component in a photosensitive resin composition is preferably 3 to 30 parts by mass, more preferably 5 to 25 parts by mass, and especially preferably 10 to 20 parts by mass, per 100 parts by mass of the total amount of the (A) component, the (B) component, the (C) component and the (D) component.

<(E) Component>

The (E) component is a polybasic acid or a polybasic acid anhydride. In the positive-type photosensitive resin composition according to the present embodiment, the content of the (E) component is lower than 40 parts by mass per 100 parts by mass of the total amount of the (A) component, the (B) component, the (C) component and the (D) component.

By adding a polybasic acid or a polybasic acid anhydride, carboxyl groups are introduced and the complex formation reaction with the surface of a metal substrate is easily caused to thereby improve the adhesivity, and further the positive-type photosensitive resin composition is enabled to be easily developed even with a weak alkali aqueous solution (developing solution).

From the viewpoint of the solubility to a solvent to be used when a photosensitive resin composition is prepared, it is preferable to use a polybasic acid anhydride as the (E) component. The polybasic acid anhydride is not especially limited as long as having an acid anhydride group formed by dehydrating condensation of carboxyl groups of a polybasic acid having a plurality of carboxyl groups. Examples of the polybasic acid anhydride include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and pyromellitic anhydride, and aromatic tetrabasic acid dianhydrides such as biphenyltetracarboxylic dianhydride, naphthalenetetracarboxylic dianhydride, diphenyl ether tetracarboxylic dianhydride, butanetetracarboxylic dianhydride, cyclopentanetetracarboxylic dianhydride, pyromellitic anhydride and benzophenonetetracarboxylic dianhydride. These may be used singly or in a combination of two or more. Among these, it is preferable for the polybasic acid anhydride to be a dibasic acid anhydride; and it is more preferable for the polybasic acid anhydride to be one or more selected from the group consisting of tetrahydrophthalic anhydride, succinic anhydride and phthalic anhydride. This case has an advantage of being capable of forming a resist pattern having a better shape.

The polybasic acid is not especially limited as long as having a polybasic acid having a plurality of carboxyl groups obtained by hydrolyzing the above polybasic acid anhydride. Further as the (E) component, there may be used a substance containing both of a polybasic acid and a polybasic acid anhydride in one molecule thereof, such as trimellitic anhydride or pyromellitic monoanhydride.

From the viewpoint of the photosensitive property and the mechanical property, the upper limit value of the content of the (E) component in a photosensitive resin composition is lower than 40 parts by mass, preferably 35 parts by mass or lower, and more preferably 30 parts by mass or lower, per 100 parts by mass of the total amount of the (A) component, the (B) component, the (C) component and the (D) component. On the other hand, the lower limit value of the content of the (E) component is higher than 0 part by mass, preferably 0.1 parts by mass or higher, more preferably 1 part by mass or higher, still more preferably 3 parts by mass or higher, and especially preferably 5 parts by mass or higher.

<(F) Component>

For the purpose of improving the coatability, the defoaming property, the leveling property and the like of a positive-type photosensitive resin composition, and improving the separability of a photosensitive layer from a support film when the composition is made into a photosensitive film, the photosensitive resin composition according to the present embodiment may contain a fluorine-based surfactant as an (F) component.

As the fluorine-based surfactant, there can be used commercially available products, for example, BM-1000, BM-1100 (hitherto, manufactured by BM Chemie GmbH, trade name); Megafac F142D, Megafac F172, Megafac F173, Megafac F183, Megafac R-08, Megafac R-30, Megafac R-90PM-20, Megafac BL-20 (hitherto, manufactured by DIC Corp., trade name, "Megafac" is its registered trademark); Fluorad FC-135, Fluorad FC-170C, Fluorad FC-430, Fluorad FC-431, Novec FC-4330, Novec FC-4432 (hitherto, manufactured by Sumitomo 3M Ltd., trade name); and Surflon S-112, Surflon S-113, Surflon S-131, Surflon S-141, Surflon S-145 (hitherto, manufactured by Asahi Glass Co., Ltd., trade name, "Surflon" is its registered trademark). Among these, from the viewpoint of more improving the crack generating property after exposure, Novec FC-4430 and Novec FC-4432, which are fluorine-based surfactants having a perfluorobutanesulfonic acid skeleton, are especially preferable. These are used singly or in a combination of two or more.

In the case where the (F) component is blended in a photosensitive resin composition, the content thereof is preferably 0.1 to 5 parts by mass, more preferably 0.2 to 2 parts by mass, and still more preferably 0.3 to 1 part by mass, per 100 parts by mass of the total amount of the (A) component, the (B) component, the (C) component and the (D) component. When the content of the (F) component exceeds 5 parts by mass, the image contrast is likely to decrease.

<(G) Component>

From the viewpoint of improving the coatability to a support film, and the adhesivity of a formed photosensitive layer to a base material and the developability thereof after exposure, the photosensitive resin composition according to the present embodiment may contain an adhesivity-imparting agent as a (G) component.

As the (G) component, there can be used an adhesive auxiliary agent such as a nitrogen-containing compound, a silane coupling agent and an aluminum chelating agent, and a solubility regulating agent such as a high-boiling point solvent.

It is preferable for the nitrogen-containing compound to have an azole group, an amino group, an amido group, an imino group, an imido group or the like, and examples thereof include imidazole, pyrazole, benzimidazole, triazole-based compounds such as benzotriazol and mercaptotriazole, alkylamines, piperidine, piperazine, morpholine, aniline, ethylenediamine, catecholamine, ethylenediaminetetraacetic acid, bipyridine, terpyridine, and phenanthroline.

It is preferable for the silane coupling agent to have a reactive substituent such as a carboxyl group, a methacryloyl group, an isocyanate group or an epoxy group, and examples thereof include trimethoxysilyl benzoate, γ-methacryloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane.

Examples of the aluminum chelating agent include aluminum ethyl acetoacetate.diisopropylate, aluminum tris(ethyl acetoacetate), aluminum bis(ethyl acetoacetate).monoacetylacetonate and aluminum trisacetylacetonate.

Among these adhesive auxiliary agents, from the viewpoint of the developability, nitrogen-containing compounds are especially preferable; triazole-based compounds are more preferable; and mercaptotriazole is still more preferable.

In the case where an adhesive auxiliary agent is blended in a photosensitive resin composition, the content thereof is preferably 0.1 to 5 parts by mass, more preferably 0.15 to 3 parts by mass, and still more preferably 0.2 to 2 parts by mass, per 100 parts by mass of the total amount of the (A) component, the (B) component, the (C) component and the (D) component.

The high-boiling point solvent is a solvent having a boiling point under normal pressure of 150° C. or higher, and examples thereof include N-methylformamide, N,N-dimethylformamide, N,N-dimethylacetamide, N-methylpyrrolidone, dimethyl sulfoxide, dihexyl ether, caproic acid, caprylic acid, 1-octanol, 1-nonanol, benzyl alcohol, benzyl acetate, ethyl benzoate, γ-butyrolactone, and phenyl cellosolve acetate.

The blending amount of the solubility regulating agent can suitably be adjusted depending on the application and the coating method, and is not especially limited as long as the blending amount is capable of homogeneous mixing of the photosensitive resin composition, but it is preferably 60% by mass or smaller with respect to the total amount of the photosensitive resin composition, and more preferably 40% by mass or smaller.

<Other Components>

In the photosensitive resin composition according to the present embodiment, a solvent later described may be contained in order to regulate the viscosity, and additives such as sensitizers, light absorbers (dyes), crosslinking agents, plasticizers, pigments, fillers, flame retardants, stabilizers, stripping accelerators, antioxidants, perfumes, imaging agents and thermal crosslinking agents may be contained, as required. These can be used singly or in a combination of two or more. The blending amount of these additives is not especially limited as long as the properties of the photosensitive resin composition are not impaired, but the blending amount is preferably 50% by mass or smaller with respect to the total amount of the photosensitive resin composition.

The preparation of the photosensitive resin composition may be made by mixing and stirring by usual methods, and in the case of adding fillers, pigments and the like, may be made by dispersing and mixing by using a dispersing machine such as a dissolver, a homogenizer or a three-roll mill. Further as required, the filtration may be carried out using a mesh, a membrane filter or the like.

[Photosensitive Film]

A photosensitive film according to the present embodiment has a support film at least one surface of which has been subjected to a release treatment, and a photosensitive layer provided on the surface of the support film which has been subjected to a release treatment and formed from the positive-type photosensitive resin composition. On the surface of the photosensitive layer opposite to the support film, as required, a protecting film can be laminated.

FIG. 1 is a schematic cross-sectional view illustrating one embodiment of the photosensitive film. The photosensitive film 10 illustrated in FIG. 1 has a structure in which a photosensitive layer 4 is laminated on a support film 2, and a protecting film 6 is further laminated on the surface of the photosensitive layer 4 opposite to the support film 2. The photosensitive layer 4 is a layer formed using the photosensitive resin composition according to the present embodiment.

<Support Film>

The support film 2 according to the present embodiment has at least one surface which has been subjected to a release treatment. Here, the release treatment refers to a chemical treatment in which the surface of a support film is thinly coated with a release agent including a silicone-based surfactant, a silicone-based compound such as a silicone resin, a fluorine-based surfactant, a fluorine-containing compound such as a fluororesin, or an alkyd resin; or a physical treatment in which a support film is corona-treated or the like.

In the case of applying a release agent on a support film, it is preferable to thinly apply the release agent within the limits of providing a release effect. After the application of the release agent, the release agent may be fixed on the support film by heat or a UV treatment. It is more preferable to provide an undercoat layer on the support film before the release agent is applied.

From the viewpoint of the coatability of a photosensitive resin composition and the separability of a photosensitive layer, the surface tension (wetting tension) at 23° C. of the release treatment-subjected surface of a support film is preferably 20 to 45 mN/m, more preferably 30 to 45 mN/m, and still more preferably 35 to 45 mN/m.

Further from the viewpoint of the separability of a photosensitive layer, the 180° peel strength at 23° C. of the release treatment-subjected surface of a support film is preferably 5 to 300 gf/inch (1.97 to 118 gf/cm or 19.3 to $1156.4 \times 10^{-3}$ N/cm), more preferably 5 to 200 gf/inch (1.97 to 78.7 gf/cm or 19.3 to $771.3 \times 10^{-3}$ N/cm), and still more preferably 100 to 200 gf/inch (39.4 to 78.7 gf/cm or 386.1 to $771.3 \times 10^{-3}$ N/cm). The 180° peel strength can be measured by a usual method (for example, a method according to JIS K6854-2) using an adhesive tape (manufactured by Nitto Denko Corp., trade name: "NITTO31B").

The support film before being subjected to a release treatment is not especially limited as long as a surface thereof is smooth, and there can be used a polymer film formed of, for example, a polyester such as a polyethylene terephthalate, or a polyolefin such as a polypropylene or a polyethylene; and among these, a polyethylene terephthalate film (hereinafter, referred to as "PET film") is preferable.

As a PET film at least one surface of which has been subjected to a release treatment with a silicone compound, for example, "Purex A53", "A31-25", "A51-25" and "A53-38" by trade name, manufactured by Teijin DuPont Films Japan Ltd., are available as commercial products ("Purex" is its registered trademark).

The thickness of the support film 2 is preferably 15 to 50 μm, and more preferably 25 to 40 μm. With the thickness of the support film 2 of smaller than 15 μm, there arises a possibility that strains in the release treatment remain and winding wrinkles are generated when the film is taken up; and with that exceeding 50 μm, bubbles are likely to be easily entrained between a base material and the photosensitive layer 4 in thermal pressure bonding when the photosensitive layer 4 is laminated on the base material.

<Protecting Film>

As the protecting film 6, there can be used a polymer film formed of, for example, a polyester such as PET, or a polyolefin such as a polypropylene or a polyethylene. As in the support film, the polymer film having been subjected to a release treatment may be used. From the viewpoint of the flexibility of the photosensitive film when being taken up in a roll-form, a polyethylene film is especially preferable as the protecting film 6. Further, it is preferable for the protecting film 6 to be a low-fish eye film so as to be able to reduce recesses of the photosensitive layer surface.

The thickness of the protecting film 6 is preferably 10 to 100 μm, and especially preferably 15 to 80 μm.

Then, a method for fabricating the photosensitive film 10 according to the present embodiment will be described.

The photosensitive layer 4 can be formed by applying the photosensitive resin composition as a liquid resist on the support film 2. When the photosensitive resin composition is applied on the support film 2, there may be used, as a coating solution, a solution prepared by dissolving the photosensitive resin composition in a predetermined solvent and having a solid content of 20 to 90% by mass, as required.

Examples of such solvents include organic solvents such as methanol, ethanol, propanol, isopropanol, ethylene glycol, propylene glycol, octane, decane, petroleum ether, petroleum naphtha, hydrogenated petroleum naphtha, solvent naphtha, acetone, methyl isobutyl ketone, diethyl ketone, diisobutyl ketone, methyl amyl ketone, methyl ethyl ketone, cyclohexanone, toluene, xylene, tetramethylbenzene, N,N-dimethylformamide, N-methyl-2-pyrrolidone, N,N-dimethylacetamide, dimethyl sulfoxide, hexamethylphosphorylamide, tetramethylene sulfone, γ-butyrolactone, ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, diethylene glycol dimethyl ether, propylene glycol monomethyl ether, propylene glycol monoethyl ether, propylene glycol monopropyl ether, propylene glycol monobutyl ether, propylene glycol monomethyl ether acetate, triethylene glycol monoethyl ether, ethyl acetate, butyl acetate, ethyl lactate, benzyl acetate, n-butyl acetate, ethoxyethyl propionate, 3-methylmethoxy propionate, ethylene glycol monoethyl ether acetate, ethylene glycol monobutyl ether acetate, diethylene glycol monoethyl ether acetate, diethylene glycol monobutyl ether acetate, dipropylene glycol monomethyl ether, dipropylene glycol diethyl ether and dipropylene glycol monomethyl ether acetate; and mixed solvents thereof.

Examples of the coating method include methods of roll coat, comma coat, gravure coat, air knife coat, die coat, bar coat, spin coat and the like. The removal of the solvent can be carried out, for example, by heating. In this case, the heating temperature is preferably about 70 to 150° C.; and the heating time is preferably about 5 to about 30 min.

The amount of the remaining organic solvent in the photosensitive layer 4 thus formed is preferably 2% by mass or smaller, from the viewpoint of preventing the diffusion of the organic solvent in subsequent steps.

With respect to the thickness of the photosensitive layer 4, though depending on the applications, the thickness after the removal of the solvent is preferably about 1 to 30 μm. In the case where a photosensitive film is used in a roll-form, the thickness of the photosensitive layer 4 is preferably made to be 1 to 5 μm, from the viewpoint of being able to reduce cracks in the photosensitive layer 4. Here in the case of fabricating a thick photosensitive film the thickness of which photosensitive layer 4 is made to be 5 pan to 30 μm, by using a modified phenol resin having unsaturated hydrocarbon groups as the (A) component, cracks of the photosensitive layer 4 can be suppressed.

The photosensitive film 10 may further have middle layers or protecting layers such as a cushioning layer, an adhesion layer, a light absorbing layer and a gas barrier layer, between the support film 2 and the photosensitive layer 4, and/or between the photosensitive layer 4 and the protecting film 6.

The photosensitive film 10, for example, can be taken up on a cylindrical or another shape winding core, and stored in a roll-form. The winding core is not especially limited as long as being one conventionally used, and examples thereof include plastics such as polyethylene resins, polypropylene resins, polystyrene resins, polyvinyl chloride resins and ABS resins (acrylonitrile-butadiene-styrene copolymers). In the storage time, it is preferable for the photosensitive film 10 to be taken up so that the support film is present outermost. Further, it is preferable to install edge surface separators on the edge surfaces of the photosensitive film (photosensitive film roll) taken up in a roll-form, from the viewpoint of the edge surface protection; and it is preferable to install moistureproofing edge surface separators additionally from the viewpoint of the edge fusion resistance. Further, it is preferable to wrap the photosensitive film 10, when packaging, in a black sheet having a low moisture permeability.

[Method for Forming a Resist Pattern]

Then, a method for forming a resist pattern will be described.

A method for forming a resist pattern comprises a step of forming a photosensitive layer on a base material by using the positive-type photosensitive resin composition, a step of exposing the photosensitive layer formed on the base material, and a step of developing the photosensitive layer with an alkali developing solution after the exposure to thereby form a resist pattern. The photosensitive layer to be formed from the positive-type photosensitive resin composition according to the present embodiment can repeatedly be subjected to an exposure step and a development step.

As the base material to form a resist pattern, there can be used, for example, a base material which has two or more layers of metal layers on a substrate constituted of a material undissolvable to an etching solution for metal use. As the substrate, there can be used a substrate constituted of, for example, a glass, a metal oxide such as titanium oxide or alumina, a semiconductor such as silicon, or an organic compound such as polyethylene terephthalate, polypropylene, polyethylene, polyester or polycarbonate. Examples of the metal layer include layers constituted of a metal such as gold, silver, copper, aluminum, iron, tungsten, molybdenum, titanium and nickel, or a metal oxide such as indium tin oxide (ITO) and zinc oxide. The metal layer can be formed by stacking the metal or metal oxide on the substrate by vacuum deposition, sputtering, electroplating, electroless plating, or chemical vapor deposition using a plasma.

Examples of a method for forming a photosensitive layer include a method in which the positive-type photosensitive resin composition is applied on a base material, and dried to vaporize a solvent and the like to thereby form a coating film (photosensitive layer), and a method in which the photosensitive layer in the above-mentioned photosensitive film is transferred to a base material.

As a method for applying a photosensitive resin composition on a base material, there can be used the same method as the above-mentioned application method on the support film.

A method for forming a photosensitive layer on a base material by using the photosensitive film 10 will be described. The method for forming a resist pattern involves laminating the photosensitive film 10 on the base material so that the photosensitive layer 4 closely adheres on the base material, and thereafter irradiating the laminate with an active light beam in an image pattern and removing exposed portions by development. Portions not irradiated with the active light beam, since the (D) component as a photosensitive agent causes interactions with phenol resins as the (A), (B) and (C) components and functions as a dissolution inhibitor, hardly dissolves in an alkali. In the portions irradiated with the active light beam, however, the (D) component is photodecomposed and the dissolution inhibition effect is lost. Thereby, the exposed portions irradiated with the active light beam become alkali-soluble.

A lamination method of the photosensitive layer 4 on the base material includes a method in which after the protecting film 6 is removed, the photosensitive layer 4 is pressure-bonded to the base material under being heated at about 70 to 130° C. by using a laminator or the like under a pressure of about 0.1 to 1 MPa (about 1 to 10 kgf/cm²). Such a lamination step may be carried out under reduced pressure.

The photosensitive layer 4 thus laminated on the base material is irradiated with an active light beam in an image pattern through a negative or positive mask pattern to thereby form exposed portions. At this time, in the case where the support film 2 present on the photosensitive layer 4 is transparent to the active light beam, the active light beam can be irradiated through the support film 2; and in the case where the support film 2 exhibits the light blocking effect on the active light beam, the photosensitive layer 4 is irradiated with the active light beam after the support film 2 is removed.

As a light source of the active light beam, there is used a conventionally well-known light source, for example, a lamp effectively radiating ultraviolet light, visible light or the like, such as a carbon arc lamp, a mercury vapor arc lamp, a high-pressure mercury lamp, or a xenon lamp. Also a laser direct writing exposure method or the like may be used.

After the formation of the exposed portions, a resist pattern is formed by removing the photosensitive layer of the exposed portions by development. Removal methods of such exposed portions include a method in which the support film 2 is removed by an autopeeler or the like in the case where the support film 2 is present on the photosensitive layer 4, and the exposed portions are removed by a wet development using a developing solution such as an alkali aqueous solution, an aqueous developing solution or an organic solvent, by a dry development or the like.

Examples of alkalis to be used in the wet development include weak alkali inorganic compounds such as sodium carbonate, potassium carbonate and ammonia; alkali metal compounds such as sodium hydroxide and potassium hydroxide; alkaline earth metal compounds such as calcium hydroxide; weak alkali organic compounds such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethyl methacrylate and polyethyleneimine; and tetramethylammonium hydroxide, and tetraethylammonium hydroxide. These may be used singly or in a combination of two or more as an aqueous solution.

The pH of the alkali aqueous solution is preferably in the range of 9 to 13; and from the viewpoint of the environmental load reduction, the pH is preferably in the range of 9 to 12. The temperature is regulated so as to suit the developability of the photosensitive layer. The alkali aqueous solution may further be mixed with a surfactant, a defoaming agent, an organic solvent and the like.

Examples of the development method include a dip method, a spray method, a brushing method, and a slapping method. Here, as a treatment after the development, the resist pattern may be cured by heating at about 60 to 250° C. before use, as required.

The resist pattern is thus obtained. The use of the photosensitive film 10 according to the present invention, since being excellent in the transferability of the photosensitive layer 4 to the base material, makes easy the separation or removal of the support film 2, enables the photosensitive layer 4 to be transferred with no defects to the base material, and resultantly enables the resist pattern having sufficiently few defects to be formed.

Further since the exposed portions of the photosensitive layer 4 easily dissolve in the weak alkali aqueous solution and strip from the base material, and are remarkably good in the weak alkali developability, a fine resist pattern excellent in contrast is enabled to be formed.

In the present embodiment, a photosensitive layer can be formed by directly applying and drying a positive-type photosensitive resin composition on the base material. In this case, the positive-type photosensitive resin composition is rotationally applied on the base material by using a spinner or the like to thereby form a coating film. The base material having the coating film formed thereon is dried by using a hot plate, an oven or the like. Thereby, the photosensitive layer is formed on the base material. An exposure step and a development step thereafter can be carried out similarly to the case of using the photosensitive film 10.

In the present embodiment, as required, the exposure and the development are allowed to be repeated twice or more times in the state that the photosensitive layer is formed on the base material. That is, when two or more layers of metal layers are etched by repeating exposure and development steps, the use of the positive-type photosensitive resin composition according to the present embodiment enables to eliminate steps of stripping a resist pattern once formed from the base material and again newly forming a photosensitive layer on the base material. Thereby, since the steps when metal layers of a base material are etched by using a resist pattern can be shortened, the use thereof is useful in cost performance and environmentally.

<Method for Manufacturing a Touch Panel>

The positive-type photosensitive resin composition according to the present embodiment can suitably be utilized for a method for manufacturing a touch panel. The method for manufacturing a touch panel according to the present embodiment comprises a step of subjecting the base material having the resist pattern formed by the method for forming a resist pattern to an etching treatment. The etching treatment is carried out on conductive layers and the like of the base material with the formed resist pattern being used as masks. By forming a pattern of lead wiring and transparent electrodes by the etching treatment, the touch panel is manufactured. Hereinafter, in comparison with the case of using a negative-type photosensitive resin composition, there will be described a method for manufacturing a touch panel using the positive-type photosensitive resin composition according to the present embodiment.

Figure 2:
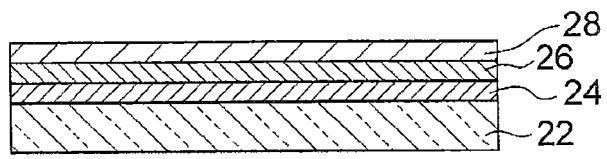
FIG. 2(a)-(h) are schematic cross-sectional views illustrating a method for manufacturing a touch panel using a negative-type photosensitive resin composition.
Figure 2:
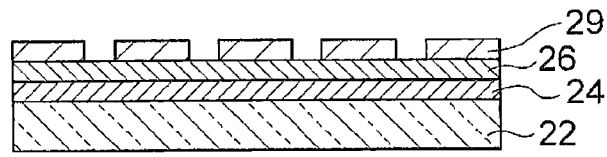
Figure 2:
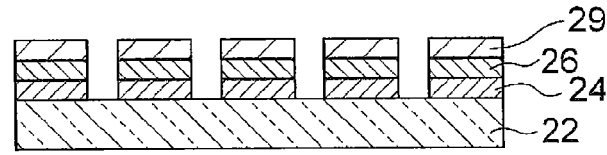
Figure 2:
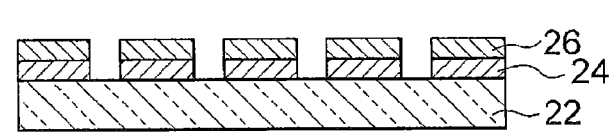
Figure 2:
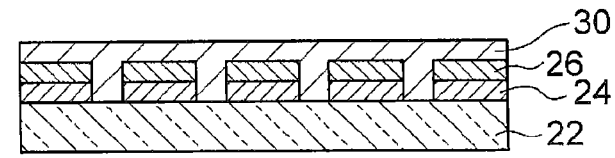
Figure 2:
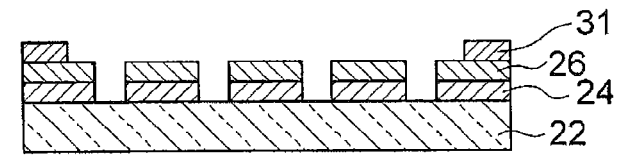
Figure 2:
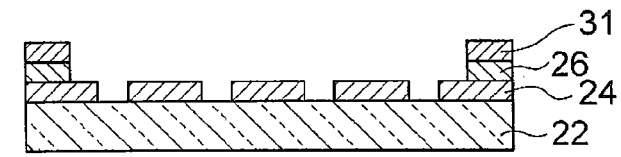
Figure 2:
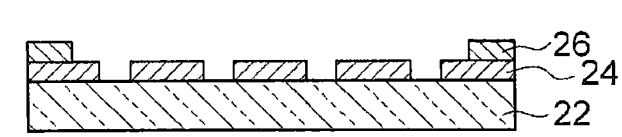

FIG. 2 is a schematic cross-sectional view illustrating a method for manufacturing a touch panel using a negative-type photosensitive resin composition. This method comprises a first step of forming a resist pattern 29 composed of a cured material of a photosensitive resin composition on a metal layer 26 of a laminated base material having a support base material 22, a transparent conductive layer 24 provided on one surface of the support base material 22, and the metal layer 26 provided on the transparent conductive layer 24, a second step of etching the metal layer 26 and the transparent conductive layer 24 to thereby form a laminated pattern (24+26 in FIG. 2(d)) composed of remaining portions of the transparent conductive layer 24 and remaining portions of the metal layer 26, and a third step of removing the metal layer from a part of the laminated pattern to thereby form transparent electrodes composed of the remaining portions of the transparent conductive layer 24 and metal wirings composed of remaining portions of the metal layer.

In the first step, first, as illustrated in FIG. 2(a), a negative-type photosensitive layer 28 using the negative-type photosensitive resin composition is laminated on the metal layer 26 of the laminated base material having the support base material 22, the transparent conductive layer 24 provided on one surface of the support base material 22, and the metal layer 26 provided on the transparent conductive layer 24. The photosensitive layer 28 may have a support film on the surface thereof opposite to the metal layer 26.

The metal layer 26 includes metal layers containing copper, an alloy of copper and nickel, a molybdenum-aluminum-molybdenum laminated body, an alloy of silver, palladium and copper, or the like. The transparent conductive layer 24 contains an indium tin oxide (ITO).

Then, a partial region of the photosensitive layer 28 is irradiated with an active light beam and cured to thereby form a cured material region, and the region excluding the cured material region of the photosensitive layer is removed from on the laminated base material. Thereby, as illustrated in FIG. 2(b), the resist pattern 29 is formed on the laminated base material.

In the second step, by the etching treatment, the metal layer 26 and the transparent conductive layer 24 which are not masked with the resist pattern 29 are removed from on the support base material 22.

A method of the etching treatment is suitably selected according to layers to be removed. Examples of an etching solution to remove the metal layer include a cupric chloride solution, a ferric chloride solution and a phosphoric acid solution. Further as an etching solution to remove the transparent conductive layer, there is used oxalic acid, hydrochloric acid, aqua regia or the like.

FIG. 2(c) is a view illustrating a state after the etching treatment; and a laminated body composed of remaining portions of the metal layer 26, remaining portions of the transparent conductive layer 24 and remaining portions of the photosensitive layer 28 is formed on the support base material 22. In the manufacture method according to the present embodiment, the resist pattern 29 is removed from this laminated body.

For the removal of the resist pattern 29, for example, an aqueous solution having a stronger alkalinity than the alkali aqueous solution used in the above-mentioned development step can be used. As the strong-alkali aqueous solution, there is used a 1 to 10-mass % sodium hydroxide aqueous solution, a 1 to 10-mass % potassium hydroxide aqueous solution, or the like. Among these, it is preferable to use a 1 to 10-mass % sodium hydroxide aqueous solution, or a 1 to 10-mass % potassium hydroxide aqueous solution; and it is more preferable to use 1 to 5-mass % sodium hydroxide aqueous solution, or a 1 to 5-mass % potassium hydroxide aqueous solution. A method for stripping the resist pattern includes an immersion method, a spray method and the like, and these may be used singly or in a combination.

FIG. 2(d) is a view illustrating a state after the stripping of the resist pattern 29; and the laminated pattern composed of remaining portions of the metal layer 26 and remaining portions of the transparent conductive layer 24 is formed on the support base material 22.

In the third step, portions of the metal layer 26 excluding portions thereof for forming the metal wirings are removed from the laminated pattern to thereby form the metal wirings composed of remaining portions of the metal layer 26 and the transparent electrodes composed of the remaining portions of the transparent conductive layer 24.

In the method of using the negative-type photosensitive resin composition, and in the case where the transparent conductive layer 24 is intended to be partially exposed by multi-stage etching, a photosensitive layer needs to be again formed.

That is, in the third step, first, a photosensitive layer 30 using a negative-type photosensitive resin composition is formed on the laminated base material having undergone the second step (FIG. 2(e)). Then, through an exposure and a development of the photosensitive layer 30, a resist pattern 31 composed of a cured material of the photosensitive layer 30 is formed (FIG. 2(f)).

Then, the metal layer 26 is removed from portions where the resist pattern 31 is not formed out of the laminated pattern by an etching treatment. At this time, as an etching solution, the same etching solution as the above-mentioned etching solution to remove the metal layer can be used.

FIG. 2(g) is a view illustrating a state after the etching treatment; and the transparent electrodes composed of remaining portions of the transparent conductive layer 24 are formed on the support base material 22, and a laminated body composed of the metal layer 26 and the resist pattern 31 is formed on a part of the transparent electrodes. By removing the resist pattern 31 from the laminated body, as illustrated in FIG. 2(h), the transparent electrodes composed of the remaining portions of the transparent conductive layer 24 and the metal wirings composed of remaining portions of the metal layer 26 are formed on the support base material 22.

By contrast, in a method of using the positive-type photosensitive resin composition according to the present embodiment, and in the case where the transparent conductive layer 24 is intended to be partially exposed by multi-stage etching, a step of again forming a photosensitive layer is not needed. In the case of a photosensitive layer to be formed from a positive-type photosensitive resin composition, since the photosensitive layer has a property in which portions thereof irradiated with light (exposed portions) can be removed with an alkali aqueous solution, and portions thereof not irradiated with light (unexposed portions) remain as a film, a pattern can be formed by again irradiating the remaining film with light.

Figure 3:
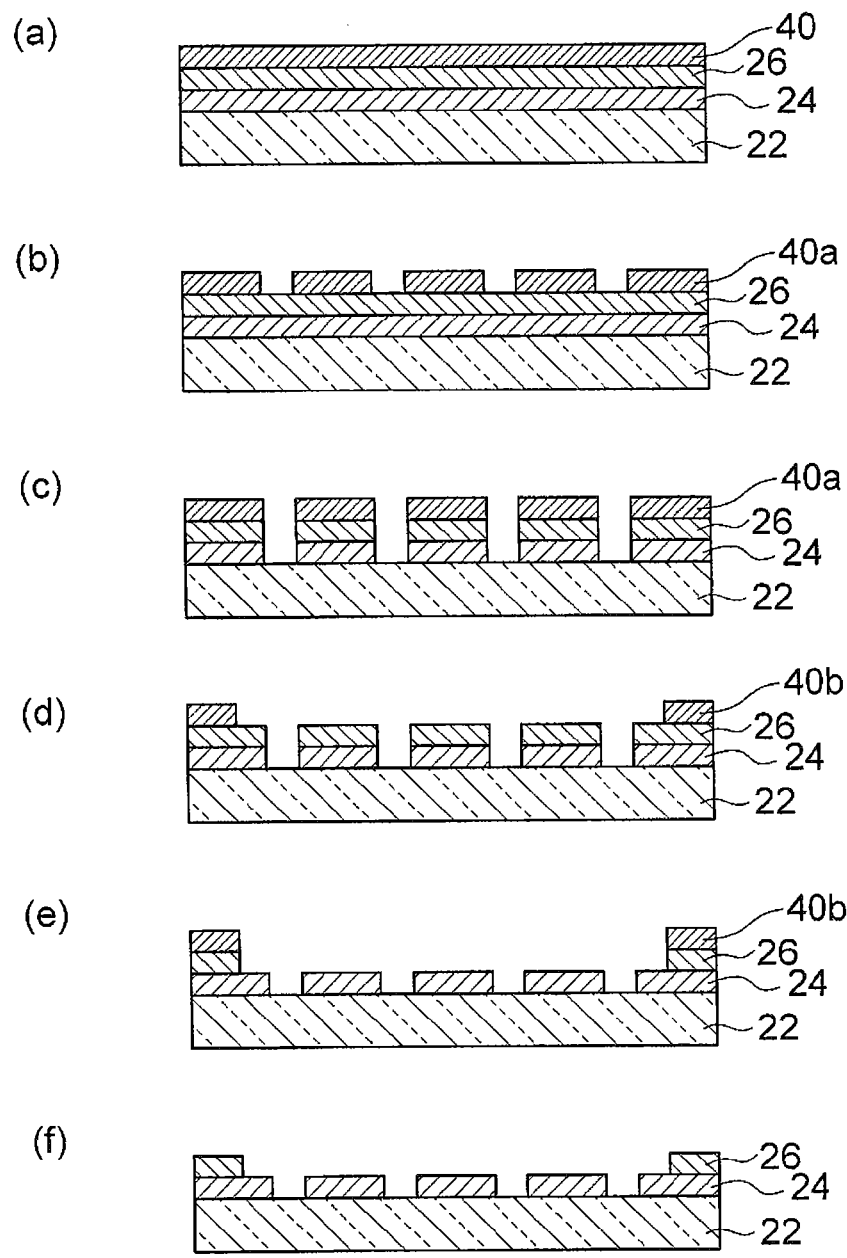
FIG. 3(a)-(f) are schematic cross-sectional views illustrating one embodiment of a method for manufacturing a touch panel using a positive-type photosensitive resin composition.

FIG. 3 is a schematic cross-sectional view illustrating one embodiment of a method for manufacturing a touch panel using the positive-type photosensitive resin composition.

In a first step, first, as illustrated in FIG. 3(a), a positive-type photosensitive layer 40 using the positive-type photosensitive resin composition is laminated on a metal layer 26 of a laminated base material having a support base material 22, a transparent conductive layer 24 provided on one surface of the support base material 22, and the metal layer 26 provided on the transparent conductive layer 24. The photosensitive layer 40 may have a support film on the surface thereof opposite to the metal layer 26.

Then, a partial region of the photosensitive layer 40 is irradiated with an active light beam to thereby form exposed portions; and thereafter, the photosensitive layer of the exposed portions is removed from on the laminated base material by development. Thereby, as illustrated in FIG. 3(b), a resist pattern 40a composed of the photosensitive layer 40 of unexposed portions is formed on the laminated base material.

In a second step, by an etching treatment, the metal layer 26 and the transparent conductive layer 24 which are not masked with the resist pattern 40a are removed from on the support base material 22.

A method of the etching treatment is suitably selected according to layers to be removed. Examples of an etching solution to remove the metal layer include an ammonium persulfate solution, a sodium persulfate solution, a cupric chloride solution, a ferric chloride solution and a phosphoric acid solution. Further as an etching solution to remove the transparent conductive layer, there is used oxalic acid, hydrochloric acid, aqua regia or the like.

FIG. 3(c) is a view illustrating a state after the etching treatment; and a laminated body composed of remaining portions of the metal layer 26, remaining portions of the transparent conductive layer 24, and the resist pattern 40a is formed on the support base material 22.

Then, in a third step, a partial region of the resist pattern 40a is irradiated with an active light beam to thereby form exposed portions, and thereafter, the photosensitive layer of the exposed portions is removed from on the laminated base material by development. Thereby, as illustrated in FIG. 3(d), a resist pattern composed of a resist pattern 40b of unexposed portions is formed on the laminated base material.

Then, by an etching treatment, the metal layer 26 is removed from portions where the resist pattern 40b is not formed out of the laminated pattern. At this time, as an etching solution, the same etching solution as the above-mentioned etching solution to remove the metal layer can be used.

FIG. 3(e) is a view illustrating a state after the etching treatment; and the transparent electrodes composed of the remaining portions of the transparent conductive layer 24 are formed on the support base material 22, and a laminated body composed of the metal layer 26 and the resist pattern 40b is formed on a part of the transparent electrodes. By removing the resist pattern 40b from the laminated body, as illustrated in FIG. 3(f), the transparent electrodes composed of the remaining portions of the transparent conductive layer 24 and metal wirings composed of remaining portions of the metal layer 26 are formed on the support base material 22.

In such a way, in the method for manufacturing a touch panel according to the present embodiment, steps corresponding to the steps (d) and (e) in FIG. 2 are not needed.

Here, although the transparent conductive layer 24 contains an indium tin oxide (ITO), the positive-type photosensitive resin composition according to the present embodiment can suitably be used also for a method for manufacturing a touch panel in which the transparent conductive layer 24 is altered from the ITO to a metal mesh.

FIG. 4 is a top view illustrating one embodiment of a touch panel 100 obtained by utilizing the present invention. In the touch panel 100, X electrodes 52 and Y electrodes 54 as transparent electrodes are alternately juxtaposed; the X electrodes 52 installed in a same row in the longitudinal direction are connected to one another by one lead wiring 56; and the Y electrodes 54 installed in a same row in the width direction are connected to one another by one lead wiring 57.

The preferred embodiments according to the present invention is described, but the present invention is not limited to the above embodiments. Various modifications and changes in the present invention may be made without departing from its gist.

EXAMPLES

Hereinafter, the present invention is described in more detail by way of Examples, but the present invention is not limited to these Examples.

(A) Component

As an (A) component, a modified novolac-type phenol resin having unsaturated hydrocarbon groups obtained from a drying oil-modified cresol was synthesized.

Synthesis Example A1

50 parts by mass of tung oil was added to 450 parts by mass of cresol in which metacresol and paracresol were mixed in a mass ratio of 40:60, and stirred; thereafter, 1.12 parts by mass of a 50-mass % paratoluenesulfonic acid methanol solution was added, and allowed to react at 120° C. for 2 hours. After the reaction, the resultant was cooled to room temperature (25° C., hereinafter the same was applied); 75 parts by mass of a 92% paraformaldehyde, 18 parts by mass of methanol and 2 parts by mass of oxalic acid were added, and stirred at 90° C. for 3 hours, and thereafter distilled under reduced pressure to remove unreacted cresol to thereby obtain a 10% tung oil-modified novolac-type phenol resin (A1). The Mw of the (A1) was 12000.

Synthesis Example A2

A 10% tung oil-modified novolac-type phenol resin (A2) was obtained by the same operation as in Synthesis Example A1, except for altering cresol to be used to orthocresol, and altering the amount of methanol added to 128 parts by mass. The Mw of the (A2) was 2000.

(B) Component

As a (B) component, a novolac-type phenol resin obtained from metacresol and paracresol was synthesized.

Synthesis Example B1

83 parts by mass of a 92% paraformaldehyde, 18 parts by mass of methanol and 1 part by mass of oxalic acid were added to 500 parts by mass of cresol in which metacresol and paracresol were mixed in a mass ratio of 40:60, and stirred at 90° C. for 3 hours, and thereafter, distilled under reduced pressure to remove unreacted cresol to thereby obtain a novolac-type phenol resin (B1) obtained from metacresol and paracresol. The Mw of the (B1) was 12000.

Synthesis Example B2

A novolac-type phenol resin (B2) obtained from metacresol and paracresol was obtained by the same operation as in B1, except for altering the amount of methanol added to 130 parts by mass. The Mw of the (B2) was 1000.

(C) Component

As a (C) component, a novolac-type phenol resin obtained from orthocresol was synthesized.

Synthesis Example C1

60 parts by mass of a 92% paraformaldehyde and 1.2 parts by mass of oxalic acid were added to 336 parts by mass of orthocresol, and stirred at 120° C. for 4 hours, and thereafter distilled under reduced pressure to remove unreacted orthocresol to thereby obtain a novolac-type phenol resin (C1) obtained from orthocresol. The Mw of the (C1) was 1000.

(D) Component

As a (D) component, "PA-28" by trade name, manufactured by Daito Chemix Corp., which is a compound represented by the following formula (7), was prepared.

[Chemical Formula 3]

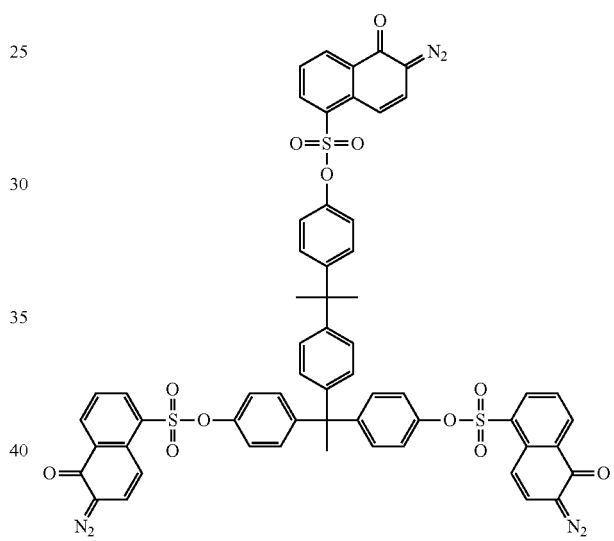

(E) Component

As (E) components, succinic acid, maleic anhydride, phthalic anhydride, trimellitic anhydride and pyromellitic anhydride were prepared.

(F) Component

As an (F) component, "FC-4430" by trade name, manufactured by Sumitomo 3M Ltd., which is a fluorine-based surfactant, was prepared.

(G) Component

As a (G) component, 3-mercapto-1,2,4-triazole (hereinafter, abbreviated to "3MT") was prepared.

Solvent

As solvents, methyl ethyl ketone (hereinafter, abbreviated to "MEK") and propylene glycol monomethyl ether acetate (hereinafter, abbreviated to "PGMEA") were prepared.

Preparation of Photosensitive Resin Compositions

Example 1

20 parts by mass of the (A1) as an (A) component, 20 parts by mass of the (B1) as a (B) component, 45 parts by mass of the (C1) as a (C) component, 15 parts by mass of "PA-28" as a (D) component, 30 parts by mass of succinic acid as an (E) component, 0.5 parts by mass of "FC-4430" as an (F) component, 0.3 parts by mass of "3MT" as a (G) component, and 140 parts by mass of "MEK" and 90 parts by mass of "PGMEA" as solvents were mixed to thereby prepare a photosensitive resin composition.

Examples 2 to 12

Photosensitive resin compositions were prepared as in Example 1, except for altering the (A), (B) or (E) component so as to have compositions (unit: parts by mass) shown in Table 1.

TABLE 1

|     |                     | Example |     |     |     |     |     |     |     |     |     |     |     |
|-----|---------------------|-----|-----|-----|-----|-----|-----|-----|-----|-----|-----|-----|-----|
|     |                     | 1   | 2   | 3   | 4   | 5   | 6   | 7   | 8   | 9   | 10  | 11  | 12  |
| (A) | A1                  | 20  | 20  | —   | —   | —   | —   | —   | —   | —   | —   | —   | —   |
|     | A2                  | —   | —   | 20  | 20  | 20  | 20  | 20  | 20  | 20  | 20  | 20  | 20  |
| (B) | B1                  | 20  | 20  | —   | —   | —   | —   | —   | —   | —   | —   | —   | —   |
|     | B2                  | —   | —   | 20  | 20  | 20  | 20  | 20  | 20  | 20  | 20  | 20  | 20  |
| (C) | C1                  | 45  | 45  | 45  | 45  | 45  | 45  | 45  | 45  | 45  | 45  | 45  | 45  |
| (D) | PA-28               | 15  | 15  | 15  | 15  | 15  | 15  | 15  | 15  | 15  | 15  | 15  | 15  |
| (E) | succinic anhydride  | 30  | —   | 30  | 20  | 10  | 5   | —   | —   | —   | —   | —   | —   |
|     | maleic anhydride    | —   | —   | —   | —   | —   | —   | 20  | —   | —   | —   | —   | —   |
|     | phthalic anhydride  | —   | 30  | —   | —   | —   | —   | —   | 30  | 20  | 10  | —   | —   |
|     | trimellitic anhydride | — | —   | —   | —   | —   | —   | —   | —   | —   | —   | 5   | —   |
|     | pyromellitic anhydride | —| —   | —   | —   | —   | —   | —   | —   | —   | —   | —   | 5   |
| (F) | FC-4430             | 0.5 | 0.5 | 0.5 | 0.5 | 0.5 | 0.5 | 0.5 | 0.5 | 0.5 | 0.5 | 0.5 | 0.5 |
| (G) | 3MT                 | 0.3 | 0.3 | 0.3 | 0.3 | 0.3 | 0.3 | 0.3 | 0.3 | 0.3 | 0.3 | 0.3 | 0.3 |
| Solvent | PGMEA           | 90  | 90  | 90  | 90  | 90  | 90  | 90  | 90  | 90  | 90  | 90  | 90  |
|     | MEK                 | 140 | 140 | 140 | 140 | 140 | 140 | 140 | 140 | 140 | 140 | 140 | 140 |

Resin Other than the (A) to (C) Components

"Maruka Lyncur M" (Mw: 18000) by trade name, manufactured by Maruzen Petrochemical Co., Ltd., which is a polyhydroxystyrene, was prepared.

Comparative Examples 1 to 4

Photosensitive resin compositions were fabricated as in Example 1, except for alteration to compositions (unit: parts by mass) shown in Table 2.

TABLE 2

|     |                    | Comparative Example 1 | Comparative Example 2 | Comparative Example 3 | Comparative Example 4 |
|-----|--------------------|------|------|------|------|
| (A) | A1                 | 20   | —    | —    | —    |
|     | A2                 | —    | 20   | 20   | 20   |
| (B) | B1                 | 20   | —    | —    | —    |
|     | B2                 | —    | 20   | —    | 20   |
| (C) | C1                 | 45   | 45   | 45   | 45   |
|     | Maruka Lyncur M    | —    | —    | 20   | —    |
| (D) | PA-28              | 15   | 15   | 15   | 15   |
| (E) | succinic anhydride | 50   | 40   | —    | —    |
| (F) | FC-4430            | 0.5  | 0.5  | 0.5  | 0.5  |
| (G) | 3MT                | 0.3  | 0.3  | 0.3  | 0.3  |
| Solvent | PGMEA          | 90   | 90   | 90   | 90   |
|     | MEK                | 140  | 140  | 140  | 140  |

Fabrication of Photosensitive Films and the Evaluation of Photosensitive Layers

Examples 1 to 12 and Comparative Examples 1 to 4

Photosensitive films were fabricated using the above photosensitive resin compositions, respectively, according to the following procedure. First, the photosensitive resin composition was applied on the release treatment-subjected surface of a PET film "Purex A53" (manufactured by Teijin DuPont Films Japan Ltd., trade name, having a film thickness of 25 µm, a 180° peel strength at 23° C. of 100 g/inch as using an adhesive tape "NITTO 31B" manufactured by Nitto Denko Corp., and a surface tension of the release treatment-subjected surface of 44 mN/m), one surface of which was subjected to a release treatment with a silicone-based compound, by using a spin coater (manufactured by Daitron Technology Co., Ltd.) under the condition of 300 rpm and for 10 sec and then under the condition of 500 rpm and for 30 sec. Then, the applied photosensitive resin composition was dried at 95° C. for 5 min in a conveyer-type drying machine (RCP Oven Line, manufactured by Dainippon Screen Mfg. Co., Ltd.) to thereby fabricate a photosensitive film having a photosensitive layer of 4.0 µm in thickness formed thereon.

The photosensitive layer of the photosensitive film was laminated on a substrate by using a roll laminator (manufactured by Hitachi Chemical Techno-Plant Co., Ltd.) under the condition of a pressure of 0.5 MPa, upper and lower roll temperatures of 120° C., and a speed of 0.5 m/min, to thereby obtain a positive-type photoresist laminated body. By using the obtained positive-type photoresist laminated body, the photosensitive layer was exposed and developed in the order of the following steps 1 to 3.

(Step 1)

The PET film was peeled off the positive-type photoresist laminated body, and the photosensitive layer was exposed by using a UV exposing machine (manufactured by Dainippon Screen Mfg. Co., Ltd., trade name: "Large Manual Exposing Machine MAP-1200") under the condition of 100 mJ/cm$^2$. For the pattern formation, a glass mask (manufactured by Toppan Printing Co., Ltd., trade name: "TOPPAN-TEST-CHART-NO1-N L78I1") was used. Then, as a developing solution, a 0.7-mass % KOH (potassium hydroxide) aqueous solution was used; and the photosensitive layer was developed at 25° C. for a predetermined time by using a spray-type developing apparatus (manufactured by Dainippon Screen Mfg. Co., Ltd., trade name: "DVW-911"), washed with distilled water, and thereafter dried by a nitrogen blow to thereby form a resist film 1.

(Step 2)

A half of the resist film 1 remaining in the step 1 was covered with a black sheet, and the resist film 1 was exposed under the condition of 100 mJ/cm$^2$ as in the step 1. The resist film 1 was developed using a 0.7-mass % KOH developing solution by a spray developing machine at 25° C. for a predetermined time as in the step 1, washed with distilled water, and thereafter dried by a nitrogen blow to thereby form a resist film 2.

(Step 3)

The whole surface of the resist film 2 remaining in the step 2 was exposed under the condition of 100 mJ/cm$^2$ as in the step 1. The resist film 2 was developed using a 0.7-mass % KOH aqueous solution by a spray developing machine at 25° C. for a predetermined time as in the step 1, and washed with distilled water. The resist film 2 was thereafter dried by a nitrogen blow.

Example 13

The photosensitive resin composition prepared in Example 1 was applied directly on a copper substrate by using a spin coater (manufactured by Daitron Technology Co., Ltd.) under the condition of 300 rpm and for 10 sec and then under the condition of 500 rpm and for 30 sec, and dried at 95° C. for 5 min in a conveyer-type drying machine (RCP Oven Line, manufactured by Dainippon Screen Mfg. Co., Ltd.) to thereby obtain a positive-type photoresist laminated body. By using the obtained positive-type photoresist laminated body and carrying out the operations of the above steps 1 to 3, the photosensitive layer was exposed and developed.

Evaluation of the Photosensitive Layer

The flexibility and the adhesivity of the photosensitive layer formed on the support film, and the repeated developability of the photosensitive layer in the steps 1 to 3 were evaluated according to the following criteria. The results are shown in Table 3 and Table 4.

(Flexibility)

The flexibility of the photosensitive layer formed on the support film was evaluated in the following five ranks as the presence/absence of cracks, separation and transfer when the photosensitive film was taken up on core materials having various diameters.

A: being able to be taken up on a core material of 1 cm in diameter
B: being able to be taken up on a core material of 3 cm in diameter
C: being able to be taken up on a core material of 5 cm in diameter
D: being able to be taken up on a core material of 10 cm in diameter
E: being able to be taken up on a core material of 20 cm in diameter (Adhesivity)

The photosensitive layer formed on the support film was laminated on a copper substrate by the above-mentioned method, and the adhesivity with the substrate was evaluated in the following five ranks. Here, the tendency of the adhesivity of the photosensitive layer was the same for gold, palladium, silver, ITO and silica.

A: no circular resist chipping being generated after the exposure
B: the area of circular resist chipping generated after the exposure being less than 10% of the whole exposed portions
C: the area of circular resist chipping generated after the exposure being 10% or more and less than 25% of the whole exposed portions
D: the area of circular resist chipping generated after the exposure being 25% or more and less than 50% of the whole exposed portions E: circular resist chipping being generated over the whole surface of the exposed portions after the exposure (Developability)

The developability of the exposed portions of the photosensitive layer in the steps 1 to 3 was evaluated. Specifically, the cutting property of pattern edge parts, the development residues of solid portions, the adherence of stripped pieces and stringy residues on the substrate were evaluated in five ranks using the following criteria. Here, the term "edge parts" refers to edge parts of a resist pattern of unexposed portions on the adhesion surface of the substrate; the term "good cutting property" indicates a shape following the photomask, and indicates that the cross-sectional shape of the resist pattern is rectangular; and the term of "poor cutting property" indicates that the cross-sectional shape of the resist pattern is not rectangular.

A: good cutting property of pattern edge parts, no development residues on solid portions, no stripped pieces, no stringy residues B: poor cutting property of pattern edge parts, no development residues on solid portions, no stripped pieces, no stringy residues C: poor cutting property of pattern edge parts, no development residues on solid portions, no stripped pieces, stringy residues being present D: poor cutting property of pattern edge parts, development residues being present on solid portions, no stripped pieces, stringy residues being present E: poor cutting property of pattern edge parts, development residues being present on solid portions, stripped pieces being present, stringy residues being present (Developing Solution Resistance)

The developing solution resistance of the unexposed portions of the photosensitive layer in the steps 1 and 2 was evaluated according to the following criteria. Specifically, cracks, the film reduction, and the stripping of the surface layer were evaluated in five ranks.

A: no cracks, no film reduction, no surface layer stripping

B: no cracks, no film reduction, surface layer stripping being present

C: cracks being present, no film reduction, no surface layer stripping

D: cracks being present, film reduction being present, no surface layer stripping E: cracks being present, film reduction being present, surface layer stripping being present (Resist Appearance)

The resist appearance of the unexposed portions of the photosensitive layer in the steps 1 and 2 was evaluated according to the following criteria. Specifically, the degree of surface roughness or irregularities was evaluated in five ranks.

A: good

B: roughness being present

C: irregularities being present

D: layer separation or white turbidity being present

E: exposure of the substrate surface being present

TABLE 3

| | | Example | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| | Flexibility | A | A | A | A | A | A | A | A | A | A | A | A | — |
| | Adhesivity | A | A | A | A | B | B | A | A | A | B | A | A | A |
| Development 1 | Developability | A | A | A | A | A | A | A | A | A | A | A | A | A |
| | Developing Solution Resistance | A | A | B | B | B | A | A | B | A | A | B | B | A |
| | Appearance | A | A | B | B | A | A | B | B | A | A | A | A | A |
| Development 2 | Developability | A | A | A | A | A | A | A | A | A | A | A | A | A |
| | Developing Solution Resistance | A | A | A | A | A | A | A | A | A | A | A | A | A |
| | Appearance | A | A | B | B | A | A | B | B | A | A | A | A | A |
| Development 3 | Developability | A | A | A | A | A | A | A | A | A | A | A | A | A |

TABLE 4

| | | Comparative Example 1 | Comparative Example 2 | Comparative Example 3 | Comparative Example 4 |
|---|---|---|---|---|---|
| | Flexibility | A | A | A | A |
| | Adhesivity | A | A | C | E |
| Development 1 | Developability | A | A | C | E |
| | Developing Solution Resistance | E | E | D | A |
| | Appearance | E | E | C | A |
| Development 2 | Developability | E | E | E | E |
| | Developing Solution Resistance | E | E | E | A |
| | Appearance | E | E | E | C |
| Development 3 | Developability | E | E | E | E |

It was confirmed that according to the positive-type photosensitive resin compositions of Examples 1 to 13, there could be formed photosensitive layers being sufficiently excellent in the developability of the exposed portions and the developing solution resistance of the unexposed portions, and being able to be repeatedly developed with a weak alkali developing solution.

REFERENCE SIGNS LIST

2: support film, 4: photosensitive layer, 6: protecting film, 10: photosensitive film, 22: support base material, 24: transparent conductive layer, 26: metal layer, 28: photosensitive layer, 29: resist pattern, 30: photosensitive layer, 31: resist pattern, 40: photosensitive layer, 40a, 40b: resist pattern, 52: transparent electrode (x electrode), 54: transparent electrode (y electrode), 56, 57: lead wiring, and 100: touch panel.

The invention claimed is:

1. A positive-type photosensitive resin composition, comprising:
   (A) a modified novolac-type phenol resin having an unsaturated hydrocarbon group;
   (B) a novolac-type phenol resin obtained from metacresol and paracresol;
   (C) a novolac-type phenol resin obtained from orthocresol;
   (D) a compound generating an acid by light; and
   (E) a polybasic acid or a polybasic acid anhydride,
   wherein a content of the polybasic acid or a polybasic acid anhydride is lower than 40 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

2. The positive-type photosensitive resin composition according to claim 1, wherein a weight-average molecular weight of the modified novolac-type phenol resin having an unsaturated hydrocarbon group is 1000 to 15000.

3. The positive-type photosensitive resin composition according to claim 1, wherein a weight-average molecular weight of the novolac-type phenol resin obtained from metacresol and paracresol is 800 to 50000.

4. The positive-type photosensitive resin composition according to claim 1, wherein a weight-average molecular weight of the novolac-type phenol resin obtained from orthocresol is 800 to 5000.

5. The positive-type photosensitive resin composition according to claim 1, wherein a content of the novolac-type phenol resin obtained from orthocresol is 20 to 60 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

6. The positive-type photosensitive resin composition according to claim 1, wherein the unsaturated hydrocarbon group has 4 to 100 carbon atoms.

7. The positive-type photosensitive resin composition according to claim 1, further comprising a fluorine-based surfactant.

8. The positive-type photosensitive resin composition according to claim 1, further comprising an adhesivity-imparting agent.

9. A photosensitive film, comprising: a support film at least one surface of which has been subjected to a release treatment; and a photosensitive layer provided on the surface of the support film which has been subjected to the release treatment, wherein the photosensitive layer is a layer formed of the positive-type photosensitive resin composition according to claim 1.

10. The positive-type photosensitive resin composition according to claim 1, wherein the content of the polybasic acid or the polybasic acid anhydride is lower than 35 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

11. The positive-type photosensitive resin composition according to claim 10, wherein the content of the polybasic acid or the polybasic acid anhydride is higher than 0.1 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

12. The positive-type photosensitive resin composition according to claim 10, wherein the content of the polybasic acid or the polybasic acid anhydride is higher than 1 part by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

13. The positive-type photosensitive resin composition according to claim 1, wherein the content of the polybasic acid or the polybasic acid anhydride is lower than 30 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

14. The positive-type photosensitive resin composition according to claim 13, wherein the content of the polybasic acid or the polybasic acid anhydride is higher than 0.1 parts by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

15. The positive-type photosensitive resin composition according to claim 13, wherein the content of the polybasic acid or the polybasic acid anhydride is higher than 1 part by mass per 100 parts by mass of a total amount of the modified novolac-type phenol resin having an unsaturated hydrocarbon group, the novolac-type phenol resin obtained from metacresol and paracresol, the novolac-type phenol resin obtained from orthocresol and the compound generating an acid by light.

* * * * *